(12) United States Patent
Lin

(10) Patent No.: US 8,001,443 B2
(45) Date of Patent: Aug. 16, 2011

(54) DATA STORAGE APPARATUS, DATA STORAGE CONTROLLER, AND RELATED AUTOMATED TESTING METHOD

(75) Inventor: Jiyun-Wei Lin, Hsinchu County (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 312 days.

(21) Appl. No.: 12/412,380

(22) Filed: Mar. 27, 2009

(65) Prior Publication Data

US 2010/0115351 A1  May 6, 2010

(30) Foreign Application Priority Data

Oct. 30, 2008  (TW) .............................. 97141742 A

(51) Int. Cl.
*G11C 29/00* (2006.01)
*G11C 16/04* (2006.01)

(52) U.S. Cl. .................................. 714/763; 365/185.33

(58) Field of Classification Search .................. 714/724, 714/725, 718, 719, 736, 819, 735, 721, 763, 714/38; 365/201, 185.33
See application file for complete search history.

(56) References Cited

U.S. PATENT DOCUMENTS

| | | | | |
|---|---|---|---|---|
| 5,023,791 A * | 6/1991 | Herzberg et al. | ............... | 701/35 |
| 5,390,325 A * | 2/1995 | Miller | ......................... | 714/38.14 |
| 6,694,459 B1 * | 2/2004 | Nyman | ......................... | 714/718 |
| 7,113,880 B1 * | 9/2006 | Rhea et al. | ..................... | 702/117 |
| 7,293,202 B2 * | 11/2007 | Kamani et al. | ............. | 714/38.14 |
| 7,418,642 B2 * | 8/2008 | Taylor et al. | ................... | 714/733 |
| 7,546,584 B2 * | 6/2009 | Rovang | ......................... | 717/124 |
| 7,783,799 B1 * | 8/2010 | Sivertsen | ........................ | 710/62 |
| 7,890,828 B2 * | 2/2011 | Taylor et al. | ................... | 714/733 |
| 2002/0199142 A1 * | 12/2002 | Gefen | ........................... | 714/724 |
| 2005/0205781 A1 * | 9/2005 | Kimba | .......................... | 250/311 |
| 2009/0235122 A1 * | 9/2009 | Rovang | ........................ | 714/38 |

* cited by examiner

*Primary Examiner* — Phung M Chung

(74) *Attorney, Agent, or Firm* — Winston Hsu; Scott Margo

(57) ABSTRACT

A data storage controller for controlling each data access of a data storage element is disclosed. The data storage controller includes a processing unit and a storage unit. The processing unit is utilized for executing an automated testing program on the data storage element for automated testing. The storage unit is coupled to the processing unit and utilized for storing the automated testing program.

25 Claims, 3 Drawing Sheets

DATA STORAGE APPARATUS, DATA STORAGE CONTROLLER, AND RELATED AUTOMATED TESTING METHOD

BACKGROUND OF THE INVENTION

1. Field of the Invention

The present invention relates to an approach for automated testing on a data storage element, and more particularly to a data storage controller, a data storage apparatus and related automated testing method thereof for automated testing on the data storage element.

2. Description of the Prior Art

In general, conventional methods for testing memory elements utilize artificiality to modify parameters continuously and test various test items step by step. For example, the testing engineer continuously modifies the setting of testing parameters according to basic information acquired from memory element manufacturers to proceed the testing, and identifies which parameter is the best setting through his own experience. Besides being time-consuming and prone to making mistakes, the drawbacks of artificiality, such as deciding the best parameter setting according to artificial experience, may result in imperfections in the test flow because of limits in the testing engineer's own experience.

SUMMARY OF THE INVENTION

It is therefore one of the objectives of the present invention to provide a data storage controller, a data storage apparatus and related automated testing method thereof for controlling each data access of a data storage element, to solve the above-mentioned problems.

According to an embodiment of the present invention, a data storage controller for controlling each data access of a data storage element is disclosed. The data storage controller comprises a processing unit and a storage unit. The processing unit is utilized for executing an automated testing program on the data storage element for automated testing. The storage unit is coupled to the processing unit and utilized for storing the automated testing program.

According to an embodiment of the present invention, a data storage apparatus is disclosed. The data storage apparatus comprises a data storage element, and a data storage controller. The data storage controller is coupled to the data storage element and utilized for controlling each data access of the data storage element and executing an automated testing procedure on the data storage element for automated testing.

According to an embodiment of the present invention, a method for utilizing a data storage controller to execute an automated testing on a data storage element is disclosed. The data storage controller controls each data access of the data storage element. The method comprises storing an automated testing program in the data storage controller; and utilizing the data storage controller to execute the automated testing program on the data storage element for automated testing.

By executing the automated testing program, the embodiments of the present invention can avoid the artificial test errors, thereby reducing labor costs and shortening the overall test time. In addition, the embodiments of the present invention will not be subject to judgments of artificial experience. Therefore, the test flow of the present invention will be more accurate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
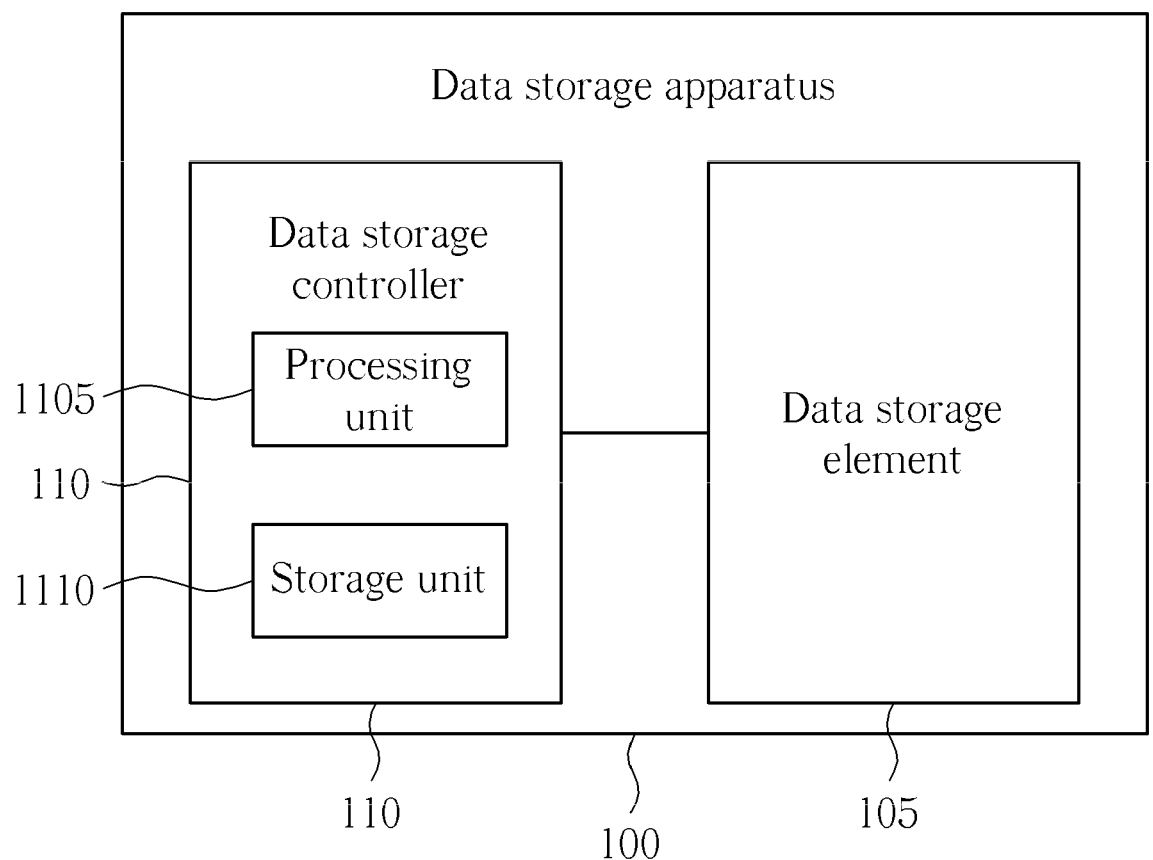
FIG. 1 is a block diagram of a data storage apparatus 100 according to one embodiment of the invention.

Please refer to FIG. 1. FIG. 1 is a block diagram of a data storage apparatus 100 according to one embodiment of the invention. The data storage apparatus 100 comprises a housing (not shown in FIG. 1), a data storage element 105, and a data storage controller 110. The data storage element 105 and the data storage controller 110 are set inside the housing. In practice, the data storage apparatus 100 of the present embodiment can be a NAND flash apparatus, for example, flash memory card. The data storage element 105 can be a NAND flash memory. The data storage controller 110 can be a flash memory controller. In general, the data storage controller 110 controls access of the data storage element 105 according to access commands of a host (not shown in FIG. 1). The data storage controller 110 transfers a logic address of the access commands into a corresponding physical address, and accesses the data storage element 105 according to the physical address. In other embodiments, the data storage element 105 is also able to utilize other types of memories for implementation, for example, a NOR flash memory. These alternative designs also fall within the scope of the invention.

Specifically, the data storage controller 110 comprises a processing unit 1105 and a storage unit 1110. The storage unit 1110 can be, but not limited to, a ROM (Read Only Memory). The storage unit 1110 is coupled to the processing unit 1105 and utilized for storing an automated testing program. The processing unit 1105 is utilized for executing the automated testing program on the data storage element 105 for automated testing. The automated testing program is aimed at the data storage element 105 to proceed tests of a plurality of various parameter settings to thereby acquire a plurality of test results, and then decide related settings for the data storage controller 110 accessing the data storage element 105 according to a specific parameter setting corresponding to a specific test result of the plurality of the test results. Practically, when testing, the processing unit 1105 of the data storage controller 110 utilizes a predetermined parameter setting that the automated testing program pre-sets for the data storage element 105 to proceed the test. Next, the processing unit 1105 adjusts the predetermined parameter setting according to units of the set interval to acquire at least one adjusted parameter setting, and tests one or more adjusted parameter settings on the data storage element 105. Therefore, through executing the automated testing program, the embodiment of the invention may avoid the artificial test errors effectively to reduce labor costs and shorten the overall test time.

In practice, the test method of the automated testing program sets a predetermined parameter setting (i.e. first set of test parameters) as an access parameter setting which the data storage controller 110 uses to access the data storage element 105. Next, the data storage controller 110 writes a test data into the data storage element 105 according to the predetermined parameter setting, and reads the written test data from the data storage element 105. If the read data is the same as the original test data, it means that the test result corresponding to the predetermined parameter setting is successful, but if the read data is different from the original test data, it means that the test result corresponding to the predetermined parameter setting is failed. Generally, the test result corresponding to the predetermined parameter setting will be successful, i.e. indicating that the predetermined parameter setting can be set as a basic parameter setting, the processing unit 1105 proceeds to adjust the predetermined parameter setting and perform the above-mentioned writing/reading test on the data storage element 105 according to the adjusted parameter settings one by one. For example, the predetermined parameter setting comprises setting a logic high-voltage level as 3.3V. If the test result corresponding to the predetermined parameter setting is also successful, the processing unit 1105 adjusts the parameter setting to set the logic high-voltage level as 3.2V or 3.1V for further testing.

As a result, the plurality of the test results respectively corresponding to the various parameter settings are obtained. The automated testing program decides a setting for accessing the data storage element 105 according to the specific parameter setting corresponding to a specific test result. In general, the automated testing program selects a specific successful test result from the plurality of the various successful test results. Then, the automated testing program utilizes the specific parameter setting corresponding to the specific successful test result as the parameter setting for accessing the data storage element 105. For example, setting the high-voltage level as 3.3V, 3.2V, or 3.1V can all lead to the successful test result, and then the automated testing program can set the 3.2V logic high-voltage level as the parameter setting for accessing the data storage element 105.

In alternative embodiments, for example, the plurality of the various parameter settings may be various widths of a signal clock for testing the written/read data on pins of the data storage element 105 and data storage controller 110. The processing unit 1105 executes the automated testing program to begin adjusting from a predetermined signal clock width according to a fixed or free interval, for example, the predetermined signal clock width may be 1µ second. The processing unit 1105 utilized the various signal clock widths obtained in each adjustment to test the data writing or reading. For example, the signal clock width is adjusted one by one to be 0.95µ second, 0.9µ second, 0.85µ second, or etc. The above-mentioned adjustment, therefore, may acquire the various test results corresponding to the various signal clock widths. The automated testing program selects the above-mentioned specific test result from said various test results, and stores the specific signal clock width corresponding to the specific test result in the data storage controller 110 as a signal clock width setting to access the data storage element 105.

In the above-mentioned embodiment, if the performed test item is an efficiency testing and the test parameter is the signal clock width, the specific test result represents an optimum efficiency test result. For example, the efficiency testing represents required time to test the data storage element 105 for writing megabyte data. Therefore, the specific test result is the shortest required time to write the megabyte data, and it represents that if the specific parameter setting (i.e. the specific signal clock width) is utilized as the signal clock width size of the connecting pins of the data storage controller 110 to access the data storage element 105, the data storage controller 110 can achieve the efficiency for writing the megabyte data into the data storage element 105 in a fastest manner.

Additionally, the plurality of the parameter settings is not limited to the various signal clock widths. In another embodiment, the plurality of the parameter settings may be various clock frequencies, various signal voltages, various signal currents or various signal setup/hold times. In other words, the plurality of the various parameter settings of the invention are various parameters of at least one of the signal clock widths, the clock frequency, the signal voltage, the signal current and the signal setup/hold time.

In addition, the performed test item of the invention is not limited to efficiency testing. In another embodiment, the test item may be a writing/reading stability testing, an energy-saving testing, or other tests. For the stability testing, the automated testing program of the invention performs a testing on the data storage element 105 according to a specific stability standard, for example, no errors are made when continuously accessing a ten thousand data. For the energy-saving testing, the automated testing program of the invention performs a testing on the data storage element 105 according to a specific power standard. For example, no errors are made when accessing the ten thousand data according to a specific power. Taking the stability testing item for example, the automated testing program of the invention may obtain the optimum setting of the various parameter settings for continuously accessing the data storage element 105 ten thousand data without errors through automatically adjusting the signal clock width, the clock frequency, the signal voltage, the signal current and the signal setup/hold time.

Furthermore, the above-mentioned embodiment pre-stores the automated testing program in the storage unit 1110 of the data storage controller 110. In other embodiment, the processing unit 1105 of the data storage controller 110 can load the automated testing program from the storage unit 1110 for automated testing, when testing the data storage element 105. However, in other embodiments, the automated testing program may also be stored in an external electronic device outside the data storage apparatus 100, for example, in a Personal Computer (PC). When the data storage apparatus 100 boots, the processing unit 1105 first downloads the automated testing program from the external electronic device, and then temporarily stores the automated testing program in the storage unit 1110. As a result, for testing on the data storage element 105, the processing unit 1105 loads the above-mentioned temporary stored automated testing program from the storage unit 1110 for automated testing, and later determines whether the test result of the automated testing program is returned to the external electronic device. Even in another embodiment, the automated testing program is designed to be pre-stored in the data storage element 105. When the data storage apparatus 100 boots, the processing unit 1105 first reads the automated testing program from the data storage element 105, and then temporarily stores the automated testing program in the storage unit 1110. Accordingly, when performing testing on the data storage element 105, the processing unit 1105 loads the above-mentioned automated testing program from the storage unit 1110 for automated testing. These alternative designs of the above-mentioned storage methods of the automated testing program all fall within the scope of the invention.

Figure 2A:
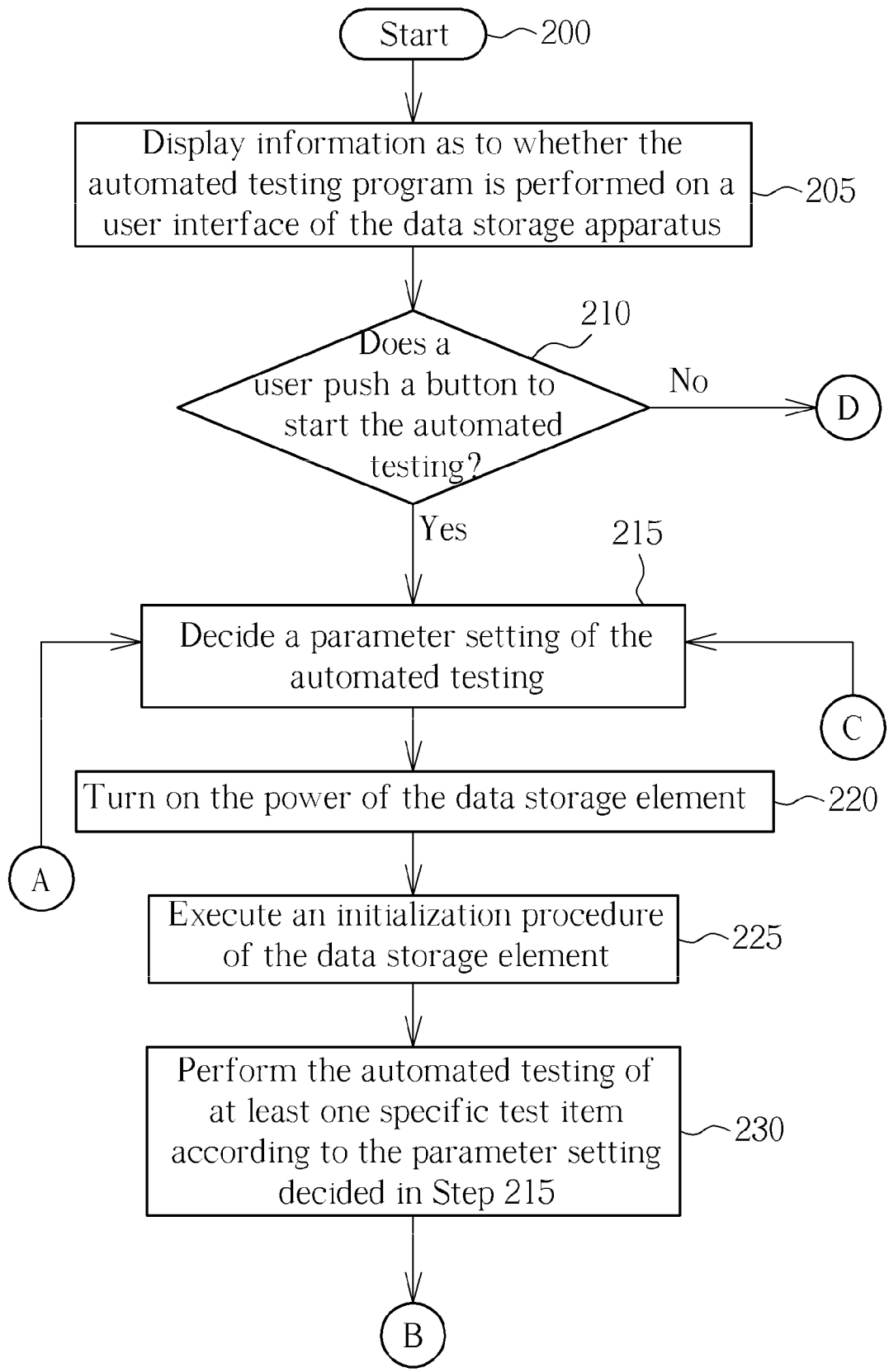
FIG. 2a and FIG. 2b are flow charts illustrating the automated testing program of the data storage controller 110 for automated testing on the data storage controller 110 shown in FIG. 1.
Figure 2B:
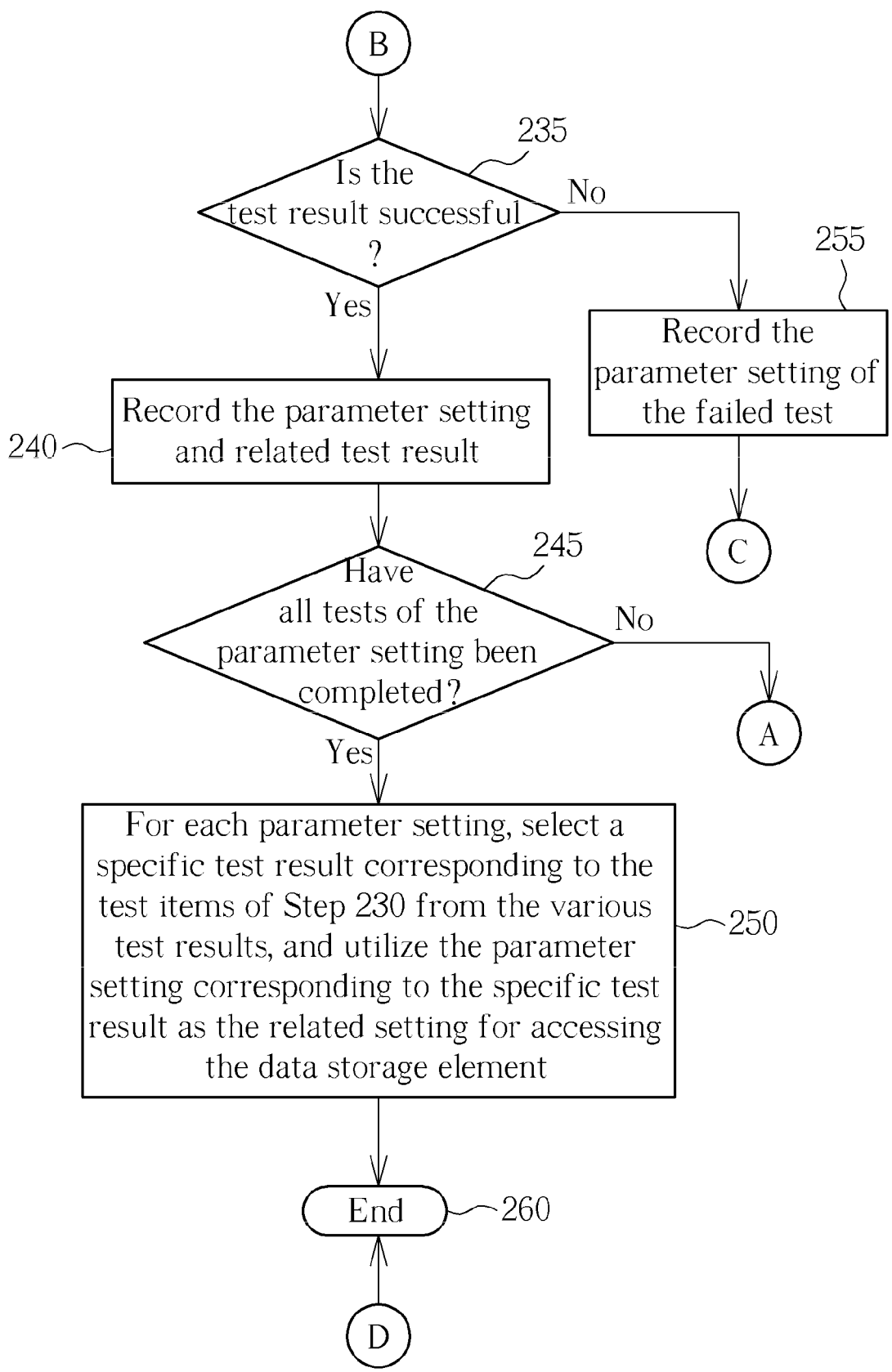

Please refer to FIG. 2a and FIG. 2b. FIG. 2a and FIG. 2b are flow charts illustrating the automated testing program of the data storage controller 110 on the data storage controller 110 shown in FIG. 1 for automated testing. Provided that substantially the same result is achieved, the steps of the flowchart shown in FIG. 2a and FIG. 2b need not be in the exact order shown and need not be contiguous, that is, other steps can be intermediate. The steps are as follows:

Step 200: Start;

Step 205: Display information as to whether the automated testing program is performed on a user interface of the data storage apparatus 100 (e.g. displaying monitor);

Step 210: Does a user push a button to start the automated testing? If yes, go to Step 215, if no, go to Step 260;

Step 215: Decide a parameter setting of the automated testing (e.g. the signal clock width, the clock frequency, the signal voltage, the signal current or the signal setup/hold time), wherein this step utilizes a predetermined parameter setting as the parameter setting of the automated testing in the first execution, and afterwards one by one adjusts the predetermined parameter setting to produce the parameter setting of the automated testing;

Step 220: Turn on the power of the data storage element 105;

Step 225: Execute an initialization procedure of the data storage element 105, wherein the initialization procedure comprises identifying what type of memory the data storage element 105 is (for example, reading the identification code of the data storage element 105 to acquire the type of the data storage element 105) and executing other initialization procedures on the data storage element 105 according to the memory type;

Step 230: Perform the automated testing of at least one specific test item according to the parameter setting decided in Step 215, wherein the specific test item comprises at least one test item of stability testing, efficiency testing, and energy-saving testing;

Step 235: Is the test result successful? If yes, go to Step 240, if no, go to Step 255;

Step 240: Record the parameter setting and related test result;

Step 245: Have all tests of the parameter setting been completed? If yes, go to Step 250, if no, go to Step 215;

Step 250: For each parameter setting, select a specific test result corresponding to the test items of Step 230 from the various test results, and utilize the parameter setting corresponding to the specific test result as the related setting for accessing the data storage element 105;

Step 255: Record the parameter setting of the failed test, and go to Step 215 again;

Step 260: End.

It is noted that, in Step 215, the decision of the parameter setting of the automated testing may only decide a single value of the parameter setting in each execution, for example, only the value of the signal clock width is decided. However, in practice, Step 215 may also decide the plurality of values of the parameter setting in each execution for following test items testing, for example, Step 215 individually decides the value of the signal clock width, the clock frequency, the signal voltage, the signal current and the signal setup/hold time, and this also obeys the spirit of the present invention. In addition, in Step 225, the operation of identifying the type of the data storage element 105 is for recording the type of the data storage element 105 and related access settings in the data storage controller 110 after the automated testing is completed. As a result, if a next user wants to utilize the data storage apparatus 100 immediately, the next user can obtain the related parameter settings directly according to the type. There is no need to execute the automated testing program again. Another advantage of the data storage apparatus 100 of the invention is that if changes of the temperature, voltage, user environment or other factors cause unfitness to the original decided parameter setting according to the automated testing program. The processing unit 1105 can still execute the automated testing program again to acquire a fit parameter setting to access the data storage element 105. As a result, a normal user (not only manufacturers of the data storage controller 110) may also perform a testing on the data storage element 105 by himself, and set various parameters of accessing the data storage element 105 according to the test result. Therefore, the user may utilize the data storage apparatus 100 with advantages of energy-saving, high efficiency and high stability. Accordingly, the data storage apparatus 100 is more convenient than the conventional memory card for using.

In addition, the above-mentioned embodiment of the invention may apply to make the manufacture of the data storage apparatus 100 produce customization requirement products easily. For example, if the required products by the customer focus on the advantages of high efficiency and low cost simultaneously, before the data storage apparatus 100 is delivered, the data storage controller 110 may utilize the automated testing program on various type memories for automated testing to find the plurality of memories which pass the efficiency testing and have the advantages of the high efficiency and corresponding parameter setting out. Then, the memory with low cost is selected from the above-mentioned memory elements as the data storage element 105. In other words, the flow steps shown in FIG. 2a and FIG. 2b of the invention may extend to applying on the variety of the memory elements for automated testing, for example, various NAND flash memory elements. As a result, the delivered data storage apparatus 100 may fit the customer requirements more closely.

After the data storage apparatus 100 is delivered (packaged), even if the specification or type of the data storage element 105 is unknown before the data storage apparatus 100 is delivered (packaged), the data storage controller 110 may execute the automated testing program on the data storage element 105 for testing when the data storage apparatus 100 boots. After the automated testing program completes the test, the data storage controller 110 acquires the related setting of the data storage element 105. As a result, the invention still operates without acquirement of the specification or type of the data storage element 105 before the data storage apparatus 100 is delivered (packaged).

Those skilled in the art will readily observe that numerous modifications and alterations of the device and method may be made while retaining the teachings of the invention.

What is claimed is:

1. A data storage controller for controlling each data access of a data storage element, transferring a logic address of an access command of a host into a corresponding physical address, and accessing the data storage element according to the corresponding physical address, the data storage controller comprising:

a processing unit, for executing an automated testing program on the data storage element for automated testing, the automated testing program performing automated testing so that the data storage controller writes test data into and reads test data from the data storage element; and a storage unit, coupled to the processing unit, for storing the automated testing program;

wherein the data storage controller and the data storage element are packaged within a flash memory card.

2. The data storage controller of claim 1, wherein the data storage element is a flash memory element.

3. The data storage controller of claim 1, wherein the processing unit executes the automated testing program on the data storage element to proceed tests of a plurality of various parameter settings to thereby acquire a plurality of test results, respectively, and decides settings for the data storage controller accessing the data storage element according to a specific parameter setting corresponding to a specific test result in the plurality of test results.

4. The data storage controller of claim 3, wherein the plurality of various parameter settings are various parameters of at least one of signal clock width, clock frequency, signal voltage, signal current and signal setup/hold time.

5. The data storage controller of claim 3, wherein the processing unit first tests a predetermined parameter setting on the data storage element, and then adjusts the predetermined parameter setting to acquire at least one adjusted parameter setting and tests the adjusted parameter setting on the data storage element.

6. The data storage controller of claim 3, wherein the processing unit executes the automated testing program on the data storage element to proceed the tests of the plurality of various parameter settings according to a plurality of various test items respectively, wherein the plurality of various test items comprise a stability testing, a efficiency testing, or an energy-saving testing.

7. The data storage controller of claim 1, wherein the processing unit first downloads the automated testing program from an external electronic device, and then temporarily stores the automated testing program in the storage unit.

8. The data storage controller of claim 1, wherein the processing unit first acquires the automated testing program from the data storage element, and then temporarily stores the automated testing program in the storage unit.

9. A data storage apparatus, comprising:
a data storage element; and
a data storage controller, coupled to the data storage element, for controlling each data access of the data storage element and executing an automated testing procedure on the data storage element for automated testing, transferring a logic address of an access command of a host into a corresponding physical address, and then accessing the data storage element according to the corresponding physical address;
wherein the data storage element and the data storage controller are packaged within the data storage apparatus as a flash memory card.

10. The data storage apparatus of claim 9, wherein the data storage controller further stores an automated testing program, and executes the stored automated testing program on the data storage element for automated testing.

11. The data storage apparatus of claim 10, wherein the data storage controller downloads the automated testing program from an external electronic device for the automated testing procedure.

12. The data storage apparatus of claim 10, wherein the data storage controller acquires the automated testing program from the data storage element for the automated testing procedure.

13. The data storage apparatus of claim 9, further comprising a housing, wherein the data storage element and the data storage controller are set inside the housing.

14. The data storage apparatus of claim 9, wherein the data storage element is a flash memory element.

15. The data storage apparatus of claim 9, wherein the data storage controller executes the automated testing procedure on the data storage to proceed tests of a plurality of various parameter settings to thereby acquire a plurality of test results, respectively, and decides settings for the data storage controller accessing the data storage element according to a specific parameter setting corresponding to a specific test result in the plurality of test results.

16. The data storage apparatus of claim 15, wherein the plurality of various parameter settings are various parameters of at least one of signal clock width, clock frequency, signal voltage, signal current and signal setup/hold time.

17. The data storage apparatus of claim 15, wherein the data storage controller first tests a predetermined parameter setting on the data storage element, and then adjusts the predetermined parameter setting to acquire at least one adjusted parameter setting and tests the adjusted parameter setting on the data storage element.

18. The data storage apparatus of claim 15, wherein the data storage controller executes the automated testing program on the data storage element to proceed the tests of the plurality of various parameter settings according to a plurality of various test items respectively, wherein the plurality of various test items comprise a stability testing, a efficiency testing, or an energy-saving testing.

19. A method for utilizing a data storage controller to execute an automated testing on a data storage element, wherein the data storage controller controls each data access of the data storage element, the method comprising:
storing an automated testing program in the data storage controller;
utilizing the data storage controller to execute the automated testing program on the data storage element for the automated testing; and
transferring a logic address of an access command of a host into a corresponding physical address and accessing the data storage element according to the corresponding physical address;
wherein the data storage element and the data storage controller are packaged within a flash memory card.

20. The method of claim 19, wherein the step of utilizing the data storage controller to execute the automated testing program on the data storage element for the automated testing comprises:
executing the automated testing program on the data storage element to proceed tests of a plurality of various parameter settings to thereby acquire a plurality of test results, respectively; and
deciding a setting for accessing the data storage element according to a specific parameter setting corresponding to a specific test result in the plurality of test results.

21. The method of claim 20, wherein the plurality of various parameter settings are various parameters of at least one of signal clock width, clock frequency, signal voltage, signal current and signal setup/hold time.

22. The method of claim 20, wherein the step of executing the automated testing program on the data storage element to proceed the tests of the plurality of various parameter settings comprises:
testing a predetermined parameter setting on the data storage element;
adjusting the predetermined parameter setting to acquire at least one adjusted parameter setting; and
testing the adjusted parameter setting on the data storage element.

23. The method of claim 20, wherein the step of executing the automated testing program on the data storage element to proceed the tests of the plurality of various parameter settings comprises:
executing the automated testing program on the data storage element to proceed the tests of the plurality of various parameter settings according to a plurality of various test items respectively, wherein the plurality of various test items comprise a stability testing, a efficiency testing, or an energy-saving testing.

24. The method of claim 19, wherein the step of storing the automated testing program in the data storage controller comprises:
downloading the automated testing program from an external electronic device, and then temporarily storing the automated testing program in the data storage controller.

25. The method of claim 19, wherein the step of storing the automated testing program in the data storage controller comprises:
acquiring the automated testing program from the data storage element first, and then temporarily storing the automated testing program in the data storage controller.

* * * * *